(12) United States Patent
Okuyama et al.

(10) Patent No.: US 12,489,044 B2
(45) Date of Patent: Dec. 2, 2025

(54) METHOD FOR PRODUCING LAYERED BODY, LAYERED BODY, AND MULTILAYERED BODY

(71) Applicant: TOYOBO CO., LTD., Osaka (JP)

(72) Inventors: Tetsuo Okuyama, Otsu (JP); Keisuke Matsuo, Otsu (JP)

(73) Assignee: TOYOBO CO., LTD., Osaka (JP)

( * ) Notice: Subject to any disclaimer, the term of this patent is extended or adjusted under 35 U.S.C. 154(b) by 147 days.

(21) Appl. No.: 18/262,986

(22) PCT Filed: Nov. 11, 2021

(86) PCT No.: PCT/JP2021/041458
§ 371 (c)(1),
(2) Date: Jul. 26, 2023

(87) PCT Pub. No.: WO2022/163065
PCT Pub. Date: Aug. 4, 2022

(65) Prior Publication Data
US 2024/0096774 A1    Mar. 21, 2024

(30) Foreign Application Priority Data
Jan. 26, 2021 (JP) ................................. 2021-010212

(51) Int. Cl.
*H01L 23/498* (2006.01)
*H01L 21/48* (2006.01)
(Continued)

(52) U.S. Cl.
CPC .... *H01L 23/49822* (2013.01); *H01L 21/4857* (2013.01); *H05K 1/0298* (2013.01);
(Continued)

(58) Field of Classification Search
CPC .................................................. H01L 23/49822
(Continued)

(56) References Cited

U.S. PATENT DOCUMENTS

| 2014/0153204 A1* | 6/2014 | Kim ...................... H05K 1/185 361/761 |
| 2016/0044792 A1* | 2/2016 | Kaneko ................ H05K 3/4682 205/125 |

(Continued)

FOREIGN PATENT DOCUMENTS

| JP | 2005-317524 A | 11/2005 |
| JP | 2008-031448 A | 2/2008 |

(Continued)

OTHER PUBLICATIONS

Japan Patent Office, International Search Report in International Patent Application No. PCT/JP2021/041458 (Jan. 25, 2022).

*Primary Examiner* — Timothy J Thompson
(74) *Attorney, Agent, or Firm* — Leydig, Voit & Mayer, Ltd.

(57) ABSTRACT

This method for producing a layered body includes: a step A for preparing a first layered body by layering a first resin film and a patterned metal layer; a step B for preparing a second resin film having indentations corresponding to the metal layer pattern; and a step C for mating the metal layer pattern and the indentations in the second resin film and bonding together the first layered body and second resin film.

10 Claims, 7 Drawing Sheets

(51) Int. Cl.
  *H05K 1/02* (2006.01)
  *H05K 1/11* (2006.01)
  *H05K 3/46* (2006.01)

(52) U.S. Cl.
  CPC ........... *H05K 1/115* (2013.01); *H05K 3/4644* (2013.01); *H05K 2201/0154* (2013.01); *H05K 2201/09563* (2013.01)

(58) Field of Classification Search
  USPC ...................................................... 174/251
  See application file for complete search history.

(56) References Cited

U.S. PATENT DOCUMENTS

| | | | | |
|---|---|---|---|---|
| 2018/0168039 | A1* | 6/2018 | Numagi | ............ H01L 23/49838 |
| 2019/0281697 | A1 | 9/2019 | Abe et al. | |

FOREIGN PATENT DOCUMENTS

| | | |
|---|---|---|
| JP | 2017-159662 A | 9/2017 |
| JP | 2018-122590 A | 8/2018 |
| JP | 2019-018403 A | 2/2019 |
| JP | 2019-046968 A | 3/2019 |
| WO | WO 2018/056466 A1 | 3/2018 |
| WO | WO 2020/004338 A1 | 1/2020 |

* cited by examiner

METHOD FOR PRODUCING LAYERED BODY, LAYERED BODY, AND MULTILAYERED BODY

TECHNICAL FIELD

The present invention relates to a method for producing a layered body, a layered body, and a multilayered body.

BACKGROUND ART

Hitherto, sheet-like layered bodies in which a patterned metal layer is coated with an electrically insulating resin have been widely used. This layered body is used, for example, as a planar heating element that generates heat when energized (see, for example, Patent Document 1). In a broad sense, sheet-like layered bodies in which a patterned metal layer is coated with an electrically insulating resin have been widely used as printed circuit boards for electric circuits. For this reason, so-called chip-layered packages, in which semiconductor chips are layered three-dimensionally, have been developed for multilayered circuit boards and semiconductor packages. An interposer inserted between semiconductor chips in a multi-chip package in which functional elements are disposed three-dimensionally, and the like may also be called a metal pattern coated with a resin. In more detail, an interposer using a polymer film with specific properties inserted between semiconductor chips of a multi-chip package having through electrodes, and the like may also be called a metal pattern coated with a resin.

As the method for producing the layered bodies, (a) a method in which a first layered body in which a patterned metal layer is layered on a first resin film is prepared and a varnish for second resin film formation is applied onto the metal layer of the first layered body, and dried; (b) a method in which a first layered body in which a patterned metal layer is layered on a first resin film is prepared, a resin powder for second resin film formation is disposed on the metal layer of the first layered body, and the resin powder is compression-molded; (c) a method in which a patterned metal layer is disposed in the center of a mold as well as a resin powder is filled in the mold and the resin powder is compression-molded; (d) a method in which a first layered body in which a patterned metal layer is layered on a first resin film is prepared, an adhesive is applied onto the metal layer of the first layered body and dried, and further a second resin film is laminated thereon and attached; (e) a method in which a first layered body in which a patterned metal layer is layered on a first resin film is prepared, an adhesive is applied onto the metal layer of the first layered body and dried, and further a second resin film is laminated thereon and attached, and the like are known.

PRIOR ART DOCUMENT

Patent Document

Patent Document 1: JP-A-2005-317524

SUMMARY OF THE INVENTION

Problems to be Solved by the Invention

However, the conventional methods for producing layered bodies have a problem that it takes time since it is required to perform a step of applying and drying a varnish for second resin film formation, or a step of compression-molding a resin powder.

In a case of adopting a production method in which a varnish for second resin film formation is applied onto the metal layer of the first layered body and dried to form a layered body, shrinkage occurs during curing (drying), and irregularities are generated on the surface of the layer (second resin film) on the side to which the varnish is applied. In other words, since there are portions where the metal layer exists and portions where the metal layer does not exist below the second resin film, there is a problem that shrinkage does not occur evenly, irregularities are generated on the surface of the second resin film, and the flatness is poor.

The present invention has been made in view of the above-described problems, and an object thereof is to provide a method for producing a layered body by which a layered body having excellent flatness can be fabricated in a short time. Another object of the present invention is to provide a layered body and a multilayered body that can be obtained by the production method.

Means for Solving the Problems

The present inventors have diligently conducted studies on a method for producing a layered body. As a result, the present inventors have found out that it is possible to fabricate a layered body having excellent flatness in a short time by adopting the following configuration, and have thus completed the present invention.

In other words, the present invention provides the following.

(1) A method for producing a layered body, the method including: a step A of preparing a first layered body in which a first resin film and a patterned metal layer are layered; a step B of preparing a second resin film having a concave corresponding to the pattern of the metal layer; and a step C of bonding the first layered body and the second resin film together while fitting the pattern of the metal layer and the concave of the second resin film into each other.

According to the configuration, since the first layered body and the second resin film can be separately prepared, a layered body can be fabricated in a short time by simply bonding the first layered body and the second resin film together.

Hitherto, in a case where a varnish for second resin film formation is applied onto a first layered body and dried to form a layered body, shrinkage has occurred during curing, and irregularities have been generated on the surface of the layer (second resin film) on the coated side, and the flatness has been poor. However, in the present invention, such shrinkage does not occur since the first layered body and the second resin film are prepared separately and then bonded together. Therefore, it is possible to fabricate a layered body having flat and parallel surfaces on both sides.

Moreover, if the first resin film and the second resin film have a vertically symmetrical structure, warping when heat is applied can be suppressed. In other words, warping occurs when heat is applied if there is a linear expansion difference between the resin films (first resin film and second resin film) and the metal layer, but the warping force generated between the first resin film and the metal layer and the warping force generated between the second resin film and the metal layer can be offset if the first resin film and the second resin film have a vertically symmetrical structure.

(2) In the configuration of (1), it is preferable that a silane coupling agent layer is provided on the metal layer of the first layered body, and the step C is a step of bonding the first layered body and the second resin film together with the silane coupling agent layer interposed therebetween.

According to the configuration, the first layered body and the second resin film are bonded together with the silane coupling agent layer interposed therebetween, and can be thus firmly bonded together. In addition, unlike a resin-based adhesive, a silane coupling agent is less susceptible to deterioration in a thermal environment. Therefore, the layered body can withstand long-term use in a thermal environment.

(3) In the configuration of (1), it is preferable that a silane coupling agent layer is provided on the second resin film, and the step C is a step of bonding the first layered body and the second resin film together with the silane coupling agent layer interposed therebetween.

According to the configuration, the first layered body and the second resin film are bonded together with the silane coupling agent layer interposed therebetween, and can be thus firmly bonded together. In addition, unlike a resin-based adhesive, a silane coupling agent is less susceptible to deterioration in a thermal environment. Therefore, the layered body can withstand long-term use in a thermal environment.

(4) In the configurations of (1) to (3), it is preferable that the first resin film and the second resin film are polyimide films.

According to the configuration, since the first resin film and the second resin film are polyimide films, a layered body exhibiting excellent heat resistance can be obtained.

(5) In the configurations of (1) to (4), it is preferable that a thickness of the metal layer is 10 µm or more and 100 µm or less.

Hitherto, in a case where a varnish for second resin film formation is applied onto a first layer and dried to form a layered body, shrinkage has occurred during curing, and irregularities have been generated on the surface of the layer (second resin film) on the coated side as described above. In particular, in a case where the metal layer is thick, the irregularities have been conspicuous.

However, according to the configuration, shrinkage as in the conventional methods does not occur since the first layered body and the second resin film are prepared separately and then bonded together. Therefore, it is possible to fabricate a layered body having flat and parallel surfaces on both sides in a case where the thickness of the metal layer is as thick as 10 µm or more as well.

The present invention also provides the following.

(6) A layered body including a first resin film, a patterned metal layer, a silane coupling agent layer, and a second resin film having a concave corresponding to the pattern of the metal layer layered in this order, in which a void exists between a first side surface of the concave of the second resin film and a second side surface of the metal layer facing the first side surface.

In the layered body produced by the method for producing a layered body, a void exists between the side surface (first side surface) of the concave of the second resin film and the side surface (second side surface) of the metal layer facing the first side surface. The reason for this is that since the first layered body and the second resin film are prepared separately and then the pattern (convex pattern) of the metal layer and the concave of the second resin film are fitted into each other in the method for producing a layered body, the concave is formed to be slightly larger than the pattern (convex pattern) of the metal layer.

In the conventional method for producing a layered body, since the varnish for second resin film formation is applied onto the metal layer of the first layered body and dried, a void 42 as in a layered body 10 according to the present embodiment is not formed.

The layered body of (6) is produced by the method for producing a layered body and can be thus fabricated in a short time. It is also possible to obtain a layered body having flat and parallel surfaces on both sides.

The present invention also provides the following.

(7) A multilayered body including two or more layered bodies according to (6) that are layered.

Since the layered body of (6) has flat and parallel surfaces on both sides, parallelism can be maintained when two or more layered bodies of (6) are layered (layered in multiple layers) as well. Moreover, since there are two or more metal layers, each metal layer can be assigned, for example, a ground layer or a power layer to separate the functions in the case of using the metal layers as a wiring layer. As a result, it is possible to form a wiring layer that is resistant to noise and hardly generates noise.

(8) A multilayered body including the layered body according to (6), a patterned second metal layer, and a third resin film layered in this order.

Since the layered body of (6) has flat and parallel surfaces on both sides, parallelism can be maintained when a patterned second metal layer and a third resin film are further layered (layered in multiple layers) on the layered body of (6) as well. In addition, the number of resin film layers can be decreased by one as compared with that in the multilayered body of (7). Moreover, since there are two or more metal layers, each metal layer can be assigned, for example, a ground layer or a power layer to separate the functions in the case of using the metal layers as a wiring layer. As a result, it is possible to form a wiring layer that is resistant to noise and hardly generates noise. In addition, in a case where the metal layer is used as a heat source and the multilayered body is used as a planar heating element, it is possible to uniformly distribute the heat by two or more metal layers.

(9) A multilayered body including two layered bodies according to (6) that are layered, in which a through hole is provided in the first resin film or the second resin film, a metal-filled layer filled with a metal is formed in the through hole, and the metal-filled layer of one layered body and the metal-filled layer of the other layered body are electrically connected to each other.

Since the layered body of (6) has flat and parallel surfaces on both sides, parallelism can be maintained when two or more layered bodies of (6) are layered (layered in multiple layers) as well.

Moreover, since there are two or more metal layers, each metal layer can be assigned, for example, a ground layer or a power layer to separate the functions in the case of using the metal layers as a wiring layer. As a result, it is possible to form a wiring layer that is resistant to noise and hardly generates noise. In addition, since the two metal layers are electrically connected to each other, a three-dimensional circuit can be formed.

Effect of the Invention

According to the present invention, it is possible to provide a method for producing a layered body by which a layered body having excellent flatness can be fabricated in a short time. It is also possible to provide a layered body and a multilayered body that can be obtained by the production method.

MODE FOR CARRYING OUT THE INVENTION

Hereinafter, embodiments of the present invention will be described. In the following, a method for producing a layered body will be described, and in the middle, the layered body will also be described.

[Method for Producing Layered Body]

The method for producing a layered body according to the present embodiment includes: a step A of preparing a first layered body in which a first resin film and a patterned metal layer are layered; a step B of preparing a second resin film having a concave corresponding to the pattern of the metal layer; and a step C of bonding the first layered body and the second resin film together while fitting the pattern of the metal layer and the concave of the second resin film into each other.

FIGS. 1 to 6 are schematic sectional views for explaining the method for producing a layered body according to the present embodiment.

<Step A>

Figure 2:
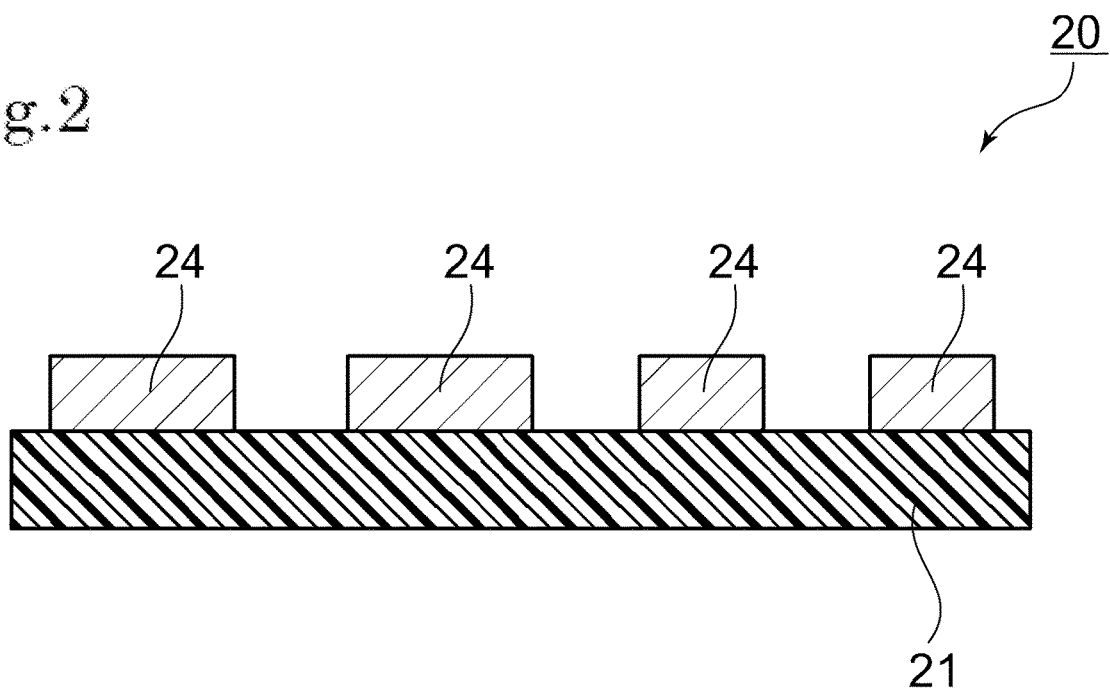
FIG. 2 is a schematic sectional view for explaining a method for producing a layered body according to the present embodiment.

In the method for producing a layered body according to the present embodiment, as illustrated in FIG. 2, a first layered body 20 in which a first resin film 21 and a patterned metal layer 24 are layered is first prepared (step A).

Figure 1:
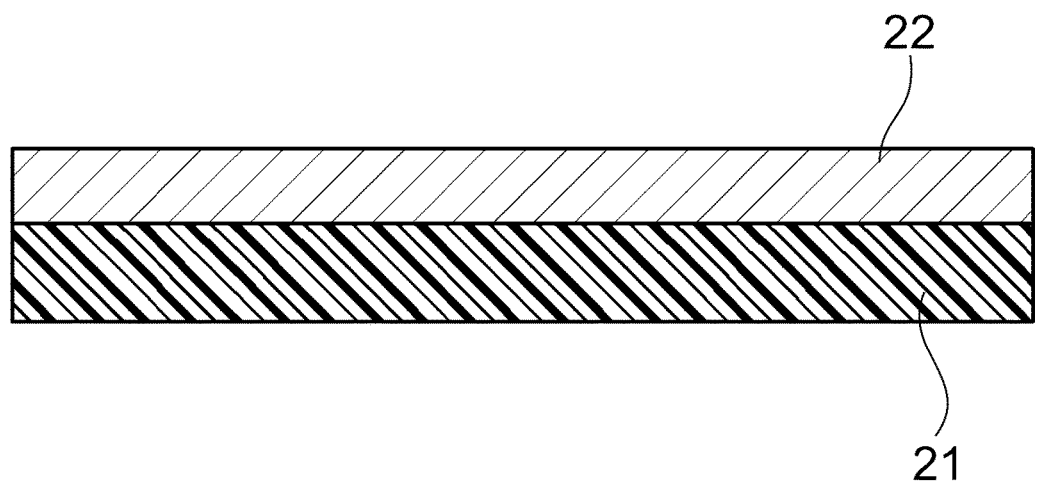
FIG. 1 is a schematic sectional view for explaining a method for producing a layered body according to the present embodiment.

The method for preparing the first layered body 20 is not particularly limited, but the first layered body 20 may be prepared by the following procedure, for example. First, as illustrated in FIG. 1, a layered body of two layers is prepared in which the first resin film 21 and an unpatterned metal layer 22 are layered. The layered body of two layers is obtained, for example, by bonding the metal layer 22 to the first resin film 21. As the metal layer 22, it is preferable to use a metal foil.

Examples of the bonding method include bonding using a silane coupling agent, which will be described later. When bonding is performed using a silane coupling agent, the two can be firmly bonded together. In addition, it is preferable to perform bonding using a silane coupling agent in terms of less thermal deterioration. The silane coupling agent may be applied to the first resin film 21, the metal layer 22, or both of these. Another bonding method includes pressure bonding. In the case of performing pressure bonding, it is preferable to subject the surface of the first resin film 21 to plasma treatment in advance. When pressure bonding is performed after the surface of the first resin film 21 has been subjected to plasma treatment, the two can be firmly bonded together. Moreover, it is preferable to perform pressure bonding after the surface of the first resin film 21 has been subjected to plasma treatment in terms of less thermal deterioration. The pressure bonding is preferably hot pressure bonding. From the viewpoint of preventing thermal deterioration, it is preferable not to use a resin-based adhesive for bonding the first resin film 21 and the metal layer 22 together.

After the layered body of two layers is prepared, the unpatterned metal layer 22 is etched by a conventionally known method to form a patterned metal layer 24 (see FIG. 2). The first layered body 20 is thus obtained. The pattern of the metal layer 24 is not particularly limited. In a case where the obtained layered body is used as a planar heating element, the metal layer may be patterned so that the surface of the layered body generates heat as evenly as possible. In a case where the obtained layered body is used as a wiring board, the metal layer may be patterned so that a desired wiring pattern is formed.

Examples of the first resin film 21 include, but are not limited to, films of polyimide-based resins (for example, aromatic polyimide resin and alicyclic polyimide resin) such as polyimide, polyamide-imide, polyetherimide, and fluorinated polyimide; copolymerized polyesters (for example, fully aromatic polyesters and semi-aromatic polyesters) such as polyethylene, polypropylene, polyethylene terephthalate, polybutylene terephthalate, and polyethylene-2,6-naphthalate; copolymerized (meth)acrylates represented by polymethylmethacrylate; polycarbonates; polyamides; polysulfones; polyethersulfones; polyetherketones; cellulose acetates; cellulose nitrates; aromatic polyamides; polyvinyl chloride; polyphenols; polyarylates; polyphenylene sulfides; polyphenylene oxides; and polystyrenes. Among others, the first resin film 21 is preferably a polyimide film. When the first resin film 21 is a polyimide film, a layered body exhibiting excellent heat resistance is obtained. In a case where the first resin film 21 is a polyimide film, imidization is preferably completed at the stage of the step A (before the step C is performed). In other words, the first resin film 21 is preferably not a film containing a precursor solution that has not been completely imidized.

The thickness of the first resin film 21 is not particularly limited, but is preferably 100 μm or less, more preferably 40 μm or less, still more preferably 30 μm or less from the viewpoint of being able to obtain a thin layered body. The lower limit of the thickness is not particularly limited, but is preferably 5 μm or more, more preferably 10 μm or more, still more preferably 15 μm or more.

The metal layer 24 (metal layer 22) is not particularly limited, but one that is easily patterned is preferable, and one that is composed of, for example, Cu, Ni, Al, Ti, Fe, Ag, Au, or an alloy thereof is preferable. Stainless steel (SUS) is preferable for the metal layer 24 (metal layer 22).

The thickness of the metal layer 24 (metal layer 22) is not particularly limited, but may be set to 3 μm or more, 10 μm or more, 20 μm or more, or the like. In the present embodiment, since the first layered body and the second resin film are prepared separately and then bonded together, curing shrinkage of the resin films (the first resin film and the second resin film) does not occur during the production of the layered body. Therefore, it is possible to fabricate a layered body having flat and parallel surfaces on both sides in a case where the thickness of the metal layer 24 is as thick as 10 μm or more as well. The upper limit of the thickness of the metal layer 24 (metal layer 22) is not particularly limited, but may be set to, for example, 100 μm or less. It is also possible to set the thickness of the metal layer 24 (metal layer 22) to less than 3 μm depending on the application of the layered body.

Figure 3:
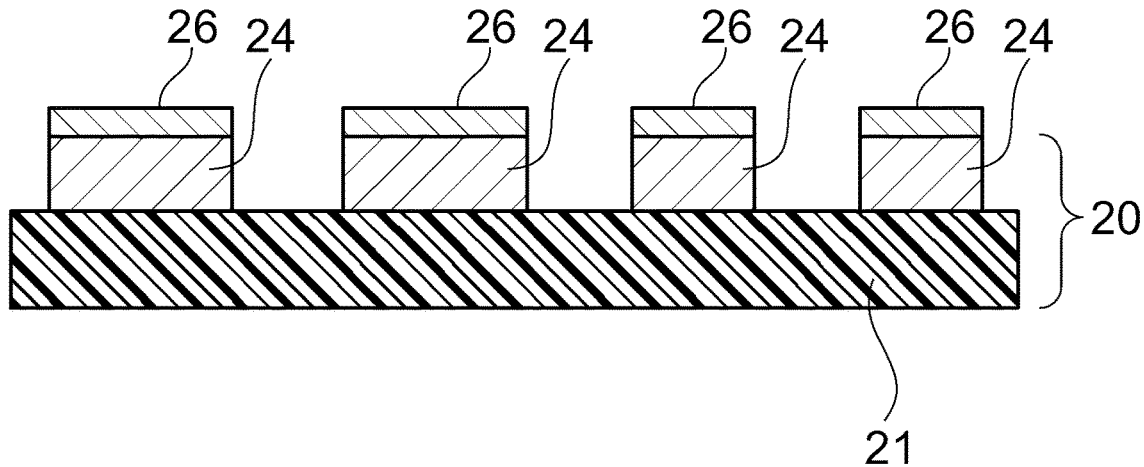
FIG. 3 is a schematic sectional view for explaining a method for producing a layered body according to the present embodiment.

A silane coupling agent layer 26 may be provided on the metal layer 24 of the first layered body 20 as illustrated in FIG. 3.

The silane coupling agent layer 26 has the action of being physically or chemically interposed between the metal layer 24 and a second resin film 32 to closely bond the metal layer 24 and the second resin film 32 to each other when the first layered body 20 and the second resin film 32 are bonded together later.

The silane coupling agent used in the present embodiment is not particularly limited, but preferably contains a coupling agent having an amino group. Preferred specific examples of the silane coupling agent include N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl N-(1,3-dimethyl-butylidene)propylamine, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, vinyltrichlorosilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-phenyl-3-aminopropyltrimethoxysilane, N-(vinylbenzyl)-2-aminoethyl-3-aminopropyltrimethoxysilane hydrochloride, 3-ureidopropyltriethoxysilane, 3-chloropropyltrimethoxysilane, 3-mercaptopropylmethyldimethoxysilane, 3-mercaptopropyltrimethoxysilane, bis(triethoxysilylpropyl)tetrasulfide, 3-isocyanatepropyltriethoxysilane, tris-(3-trimethoxysilylpropyl)isocyanurate, chloromethylphenetyltrimethoxysilane, chloromethyltrimethoxysilane, aminophenyltrimethoxysilane, aminophenethyltrimethoxysilane, and aminophenylaminomethylphenethyltrimethoxysilane.

As the silane coupling agent, in addition to the above, n-propyltrimethoxysilane, butyltrichlorosilane, 2-cyanoethyltriethoxysilane, cyclohexyltrichlorosilane, decyltrichlorosilane, diacetoxydimethylsilane, diethoxydimethylsilane, dimethoxydimethylsilane, dimethoxydiphenylsilane, dimethoxymethylphenylsilane, dodecyltrichlorosilane, dodecyltrimethoxysilane, ethyltrichlorosilane, hexyltrimethoxysilane, octadecyltriethoxysilane, octadecyltrimethoxysilane, n-octyltrichlorosilane, n-octyltriethoxysilane, n-octyltrimethoxysilane, triethoxyethylsilane, triethoxymethylsilane, trimethoxymethylsilane, trimethoxyphenylsilane, pentyltriethoxysilane, pentyltrichlorosilane, triacetoxymethylsilane, trichlorohexylsilane, trichloromethylsilane, trichlorooctadecylsilane, trichloropropylsilane, trichlorotetradecylsilane, trimethoxypropylsilane, allyltrichlorosilane, allyltriethoxysilane, allyltrimethoxysilane, diethoxymethylvinylsilane, dimethoxymethylvinylsilane, trichlorovinylsilane, triethoxyvinylsilane, vinyltris(2-methoxyethoxy)silane, trichloro-2-cyanoethylsilane, diethoxy(3-glycidyloxypropyl)methylsilane, 3-glycidyloxypropyl(dimethoxy)methylsilane, 3-glycidyloxypropyltrimethoxysilane, and the like may also be used.

Among the silane coupling agents, silane coupling agents having one silicon atom in one molecule are particularly preferable, and examples thereof include N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, aminophenyltrimethoxysilane, aminophenetyltrimethoxysilane, and aminophenylaminomethylphenetyltrimethoxysilane. In a case where particularly high heat resistance is required, a silane coupling agent in which an aromatic group links Si and an amino group to each other is desirable.

A coupling layer other than the silane coupling agent layer 26 may be provided on the metal layer 24 of the first layered body 20.

As a coupling agent for forming the coupling layer, in addition to the above, 1-mercapto-2-propanol, methyl 3-mercaptopropionate, 3-mercapto-2-butanol, butyl 3-mercaptopropionate, 3-(dimethoxymethylsilyl)-1-propanethiol, 4-(6-mercaptohexaroyl)benzyl alcohol, 11-amino-1-undecenethiol, 11-mercaptoundecylphosphonic acid, 11-mercaptoundecyltrifluoroacetic acid, 2,2'-(ethylenedioxy)diethanethiol, 11-mercaptoundecytri(ethylene glycol), (1-mercaptoundec-11-yl)tetra(ethylene glycol), 1-(methylcarboxy)undec-11-yl)hexa(ethylene glycol), hydroxyundecyl disulfide, carboxyundecyl disulfide, hydroxyhexadodecyl disulfide, carboxyhexadecyl disulfide, tetrakis(2-ethylhexyloxy)titanium, titanium dioctyloxy bis(octylene glycolate), zirconium tributoxy monoacetylacetonate, zirconium monobutoxy acetylacetonate bis(ethylacetoacetate), zirconium tributoxy monostearate, acetoalkoxy aluminum diisopropylate, 3-glycidyloxypropyltrimethoxysilane, 2,3-butanedithiol, 1-butanethiol, 2-butanethiol, cyclohexanethiol, cyclopentanethiol, 1-decanethiol, 1-dodecanethiol, 2-ethylhexyl 3-mercaptopropionate, ethyl 3-mercaptopropionate, 1-heptanethiol, 1-hexadecanethiol, hexyl mercaptan, isoamyl mercaptan, isobutyl mercaptan, 3-mercaptopropionic acid, 3-methoxybutyl 3-mercaptopropionate, 2-methyl-1-butanethiol, 1-octadecanethiol, 1-octanethiol, 1-pentadecanethiol, 1-pentanethiol, 1-propanethiol, 1-tetradecanethiol, 1-undecanethiol, 1-(12-mercaptodo-decyl)imidazole, 1-(11-mercaptoundecyl) imidazole, 1-(10-mercaptodecyl)imidazole, 1-(16-mercaptohexadecyl)imidazole, 1-(17-mercaptoheptadecyl) imidazole, 1-(15-mercapto)dodecanoic acid, 1-(11-mercapto)undecanoic acid, 1-(10-mercapto)decanoic acid, and the like may also be used.

As the method for applying a silane coupling agent (method for forming a silane coupling agent layer), a method in which a silane coupling agent solution is applied to the metal layer 24, a vapor deposition method, and the like may be used. At this time, the silane coupling agent layer 26 may be formed not only on the metal layer 24 but also on the first resin film 21. In other words, the silane coupling agent solution may also be applied to the first resin film 21 when applied to the metal layer 24, or the silane coupling agent solution may also be vapor-deposited onto the first resin film 21 when vapor-deposited onto the metal layer 24. The silane coupling agent layer may be formed on the side surface of the patterned metal layer 24. However, in a case where the silane coupling agent layer is formed on the side surface of the metal layer 24 as well, the silane coupling agent layer formed on the side surface of the metal layer 24 is preferably not attached to a first side surface 36 (see FIG. 6) of a concave 34 of the second resin film 32. As the silane coupling agent layer formed on the side surface of the metal layer 24 is not attached to the first side surface 36 of the concave 34 of the second resin film 32, the obtained layered body (for example, layered body 10 to be described later) is a layered body that is easily bent.

The silane coupling agent layer may be formed on the surface of the concave 34 of the second resin film 32. The silane coupling agent layer may be formed both on the metal layer 24 and on the concave 34 of the second resin film 32.

The film thickness of the silane coupling agent layer 26 is not particularly limited, but is only required to cover the entire surface of the metal layer 24.

<Step B>

Figure 5:
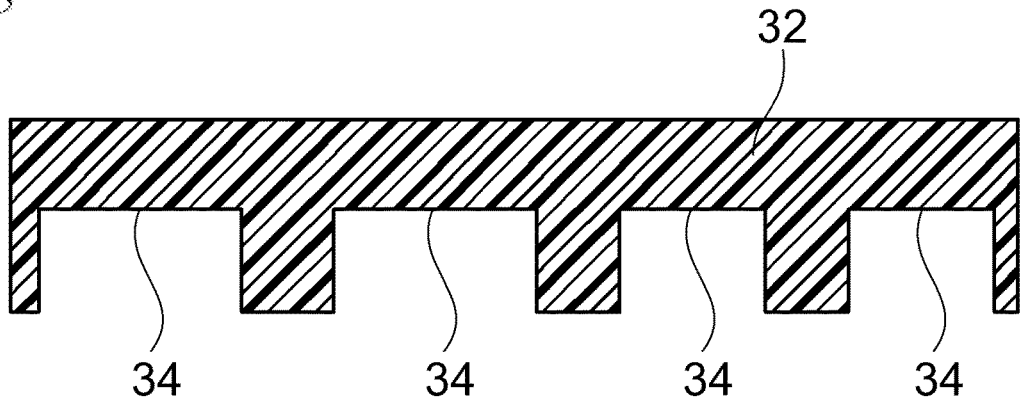
FIG. 5 is a schematic sectional view for explaining a method for producing a layered body according to the present embodiment.

In the method for producing a layered body according to the present embodiment, separately from the step A, the second resin film 32 having a concave 34 corresponding to the pattern (convex pattern) of the metal layer 24 is prepared (step B) as illustrated in FIG. 5.

The method for preparing the second resin film 32 having the concave 34 is not particularly limited, but the second resin film 32 may be prepared by the following procedure, for example.

Figure 4:
FIG. 4 is a schematic sectional view for explaining a method for producing a layered body according to the present embodiment.

First, as illustrated in FIG. 4, an unpatterned second resin film 31 is prepared.

The material for the second resin film 31 is not particularly limited, but a similar material to that for the first resin film 21 may be used. Among others, the second resin film 31 is preferably a polyimide film. When the second resin film 31 is a polyimide film, a layered body exhibiting excellent heat resistance is obtained. The material for the first resin film 21 and the material for the second resin film 31 may be the same as or different from each other.

The thickness of the second resin film 31 is not particularly limited, but is preferably 100 μm or less, more preferably 50 μm or less, still more preferably 30 μm or less from the viewpoint of being able to obtain a thin layered body.

The lower limit of the thickness is not particularly limited, but is preferably 10 μm or more, more preferably 15 μm or more, still more preferably 20 μm or more.

In a case where the thicknesses of the upper and lower resin films of the obtained layered body 10 are the same, the thickness of the second resin film 31 is preferably the sum of the thickness of the first resin film 21 and the thickness of the metal layer 24.

Next, the unpatterned second resin film 31 is etched by a conventionally known method to form the concave 34 corresponding to the pattern (convex pattern) of the metal layer 24. In a case where a polyimide film is used as the second resin film 31, for example, the second resin film 31 is etched by a conventionally known method using an alkaline chemical. The second resin film 32 having the concave 34 is thus obtained (see FIG. 5). The depth of the concave 34 is preferably about the same as the thickness of the metal layer 24. The size (width) of the concave 34 is preferably set to be slightly larger than the width of the pattern (convex pattern) of the metal layer 24. This is to securely fit the pattern (convex pattern) of the metal layer 24 and the concave 34 of the second resin film 32 into each other at the time of fitting later.

<Step C>

Figure 6:
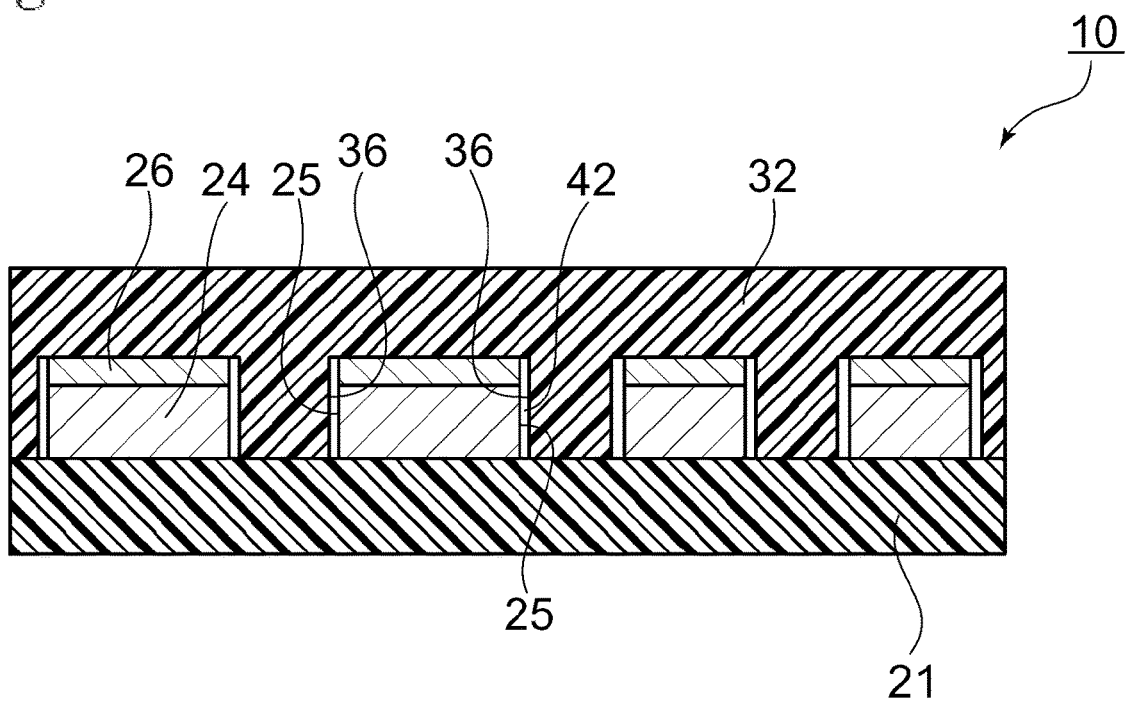
FIG. 6 is a schematic sectional view for explaining a method for producing a layered body according to the present embodiment.

After the step A and step B, the first layered body 20 and the second resin film 32 are bonded together while the pattern of the metal layer 24 and the concave 34 of the second resin film 32 are fitted into each other (step C) as illustrated in FIG. 6.

In the present embodiment, since the silane coupling agent layer 26 is provided on the metal layer 24 of the first layered body 20, the first layered body 20 and the second resin film 32 are bonded together with the silane coupling agent layer 26 interposed therebetween in the step C. The first layered body 20 and the second resin film 32 are bonded together with the silane coupling agent layer 26 interposed therebetween, and can be thus firmly bonded together. In addition, unlike a resin-based adhesive, a silane coupling agent is less susceptible to deterioration in a thermal environment. Therefore, the layered body can withstand long-term use in a thermal environment.

However, in the method for producing a layered body according to the invention, the silane coupling agent layer 26 may not be provided. In this case, the first layered body 20 and the second resin film 32 can be bonded together by pressure bonding. In the case of performing pressure bonding, it is preferable to subject the surface of the second resin film 32 to plasma treatment in advance. When pressure bonding is performed after the surface of the second resin film 32 has been subjected to plasma treatment, the two can be firmly bonded together. Moreover, it is preferable to perform pressure bonding after the surface of the second resin film 32 has been subjected to plasma treatment in terms of less thermal deterioration. The pressure bonding is preferably hot pressure bonding. From the viewpoint of preventing thermal deterioration, it is preferable not to use a resin-based adhesive for bonding the first layered body 20 and the second resin film 32 together.

The layered body 10 is obtained through the steps described above.

In the above-described embodiment, a case where the silane coupling agent layer is provided on the metal layer of the first layered body has been described. However, the invention is not limited to this example, and the silane coupling agent layer may be provided on the second resin film instead of providing the silane coupling agent layer on the metal layer of the first layered body. In this configuration as well, the first layered body and the second resin film can be bonded together with the silane coupling agent layer interposed therebetween in the step C.

The layered body 10 obtained by the method for producing a layered body described above has the following configuration. In other words, in the layered body 10, the first resin film 21, the patterned metal layer 24, the silane coupling agent layer 26, and the second resin film 32 having the concave 34 corresponding to the pattern of the metal layer 24 are layered in this order, and the void 42 exists between the first side surface 36 of the concave 34 of the second resin film 32 and the second side surface 25 of the metal layer 24 facing the first side surface 36.

The layered body 10 is produced by the method for producing a layered body and can be thus fabricated in a short time. Since the first layered body and the second resin film are separately prepared and then bonded together to produce the layered body 10, the layered body 10 having flat and parallel surfaces on both sides can be obtained.

The warpage of the layered body 10 after heated at 300° C. measured by the following measurement method is preferably 5% or less, more preferably 3% or less, still more preferably 1% or less.

<Warpage of Layered Body after Heated at 300° C.>

Figure 7:
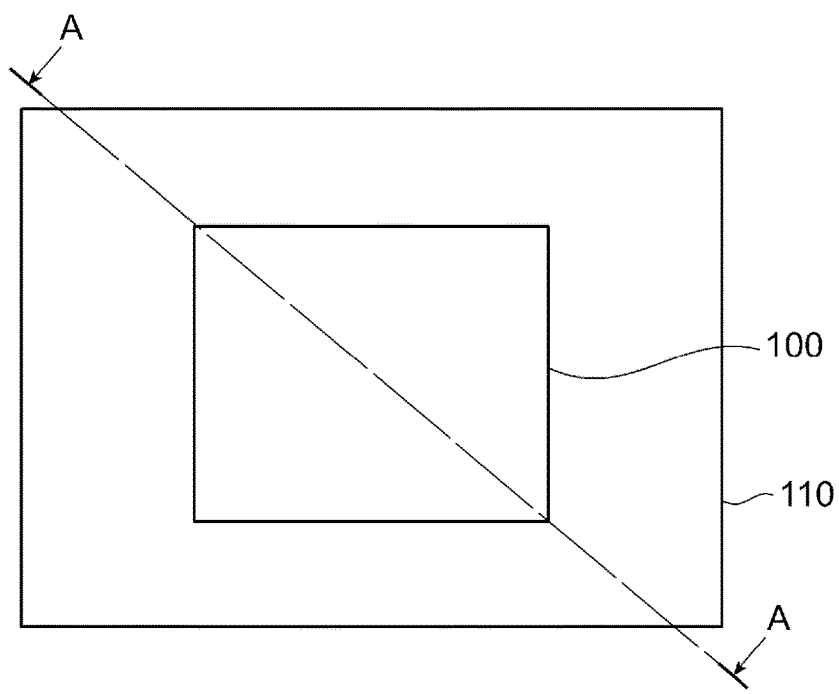
FIG. 7 is a plan view for explaining how to determine the warpage of a layered body after heated at 300° C.
Figure 8:
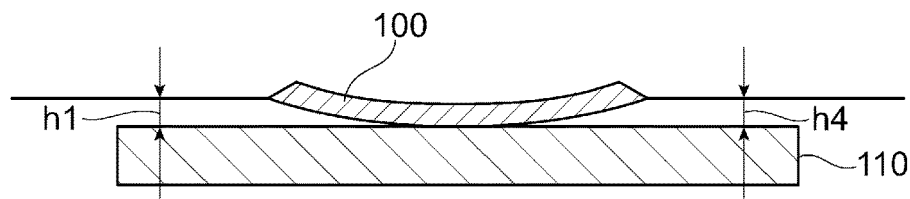
FIG. 8 is a sectional view taken along line A-A of FIG. 7.

The warpage (%) of the layered body after heated at 300° C. means the degree of deformation in the thickness direction with respect to the surface direction of the layered body before and after heated at 300° C. Specifically, the warpage means a value acquired by the following procedure. FIG. 7 is a plan view for explaining how to determine the warpage of the layered body after heated at 300° C., and FIG. 8 is the sectional view taken along line A-A. First, as illustrated in FIGS. 7 and 8, a test piece 100 (layered body) of 100 mm×100 mm is prepared. The test piece 100 is placed on a surface plate 110 so as to be in a concave shape at room temperature, and the average value of the distances from the plane of the four corners (h1$rt$, h2$rt$, h3$rt$, and h4$rt$: unit: mm) is defined as the "original warped amount (mm)". Next, the test piece is subjected to heat treatment at 300° C. for 1 hour and then placed on a plane surface so as to be in a concave shape, and the average value of the distances from the plane of the four corners (h1, h2, h3, and h4: unit: mm) is defined as "warped amount (mm)". The difference acquired by subtracting the "original warped amount" from the "warped amount" is defined as the "warped amount before and after heat treatment at 300° C.". The "warpage (%) of the layered body after heated at 300° C." is a value expressed as a percentage (%) of the curled amount with respect to the distance (70.7 mm) from each vertex to the center of the test piece. The measured value is the average value of 10 pieces (10 test pieces).

However, in a case where there are not enough layered bodies to sample 10 pieces as well, the measurement is performed on 3 or more sheets. Specifically, the warpage is calculated by the following equations.

Original warped amount (mm)=($h1rt+h2rt+h3rt+h4rt$)/4

Warped amount (mm)=($h1+h2+h3+h4$)/4

Warped amount before and after heat treatment at 300° C. (mm)=(warped amount)−(original warped amount)

Warpage of layered body after heated at 300° C. (%)=100×(warped amount before and after heat treatment at 300° C.)/70.7

Next, the multilayered body and the method for producing a multilayered body according to the present embodiment will be described.

First Embodiment

Figure 9:
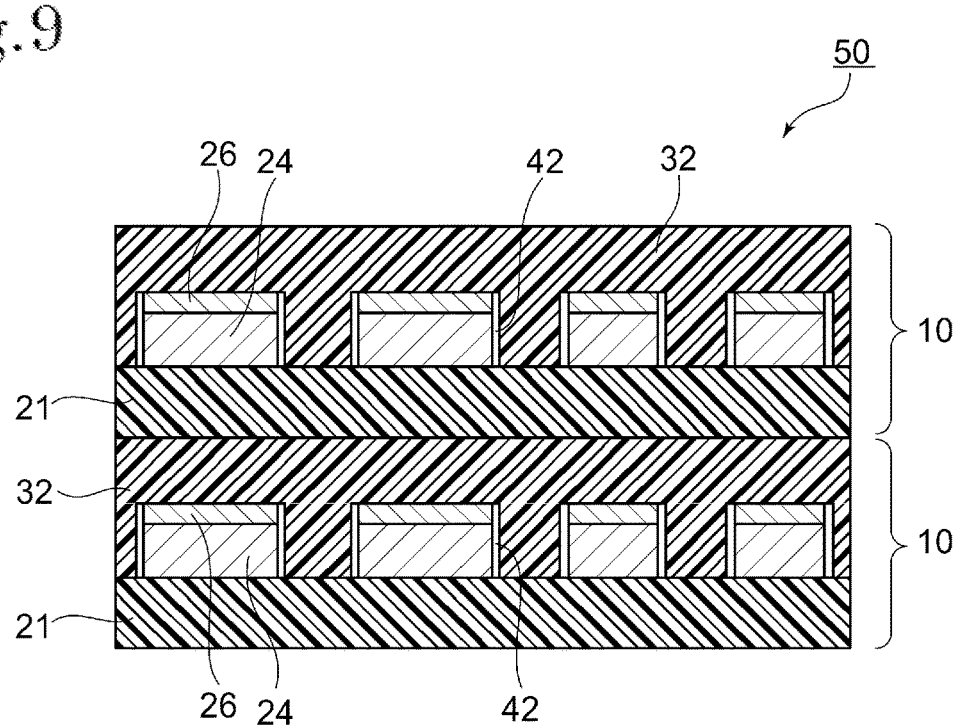
FIG. 9 is a schematic sectional view illustrating a multilayered body according to a first embodiment.

FIG. 9 is a schematic sectional view illustrating the multilayered body according to the first embodiment. As illustrated in FIG. 9, a multilayered body 50 according to the first embodiment has a configuration in which two layered bodies 10 described above are layered. In the multilayered body 50, two layered bodies 10 are layered so that the first resin film 21 of one layered body 10 (upper layered body 10 in FIG. 9) faces the second resin film 32 of the other layered body 10 (lower layered body 10 in FIG. 9).

The multilayered body 50 is obtained by bonding two layered bodies 10 together.

Examples of the method for bonding one layered body 10 and the other layered body 10 together include a method in which two layered bodies 10 are bonded together via a silane coupling agent layer interposed therebetween as described above. Specific examples thereof include a method in which a silane coupling agent layer is formed on the first resin film 21 of one layered body 10 and then one layered body 10 is bonded to the other layered body 10, and a method in which a silane coupling agent layer is formed on the second resin film 32 of the other layered body 10 and then the other layered body 10 is bonded to one layered body 10. When bonding is performed using a silane coupling agent, the two can be firmly bonded together. In addition, it is preferable to perform bonding using a silane coupling agent in terms of less thermal deterioration.

Another bonding method includes pressure bonding. In the case of performing pressure bonding, it is preferable to subject the resin film to be the bonding surface (first resin film 21 and/or second resin film 32) to plasma treatment in advance. When pressure bonding is performed after the plasma treatment has been performed, the two layered bodies can be firmly bonded together. It is preferable to perform pressure bonding after the plasma treatment has been performed in terms of less thermal deterioration. The pressure bonding is preferably hot pressure bonding. From the viewpoint of preventing thermal deterioration, it is preferable not to use a resin-based adhesive for bonding the first resin film 21 and the metal layer 22 together.

In the above-described multilayered body 50, a case where two layered bodies 10 are layered so that the first resin film 21 of one layered body 10 faces the second resin film 32 of the other layered body 10 has been described, but the multilayered body according to the present invention is not limited to this example, and two layered bodies may be layered so that the first resin film of one layered body faces the first resin film of the other layered body, or two layered bodies may be layered so that the second resin film of one layered body faces the second resin film of the other layered body.

In the above-described multilayered body 50, a case where two layered bodies 10 are layered has been described, but the multilayered body according to the present invention is not limited to this example, and three or more layered bodies 10 may be layered. As the method for layering the third layer, a method similar to the above may be adopted.

According to the multilayered body of the first embodiment, since the layered body 10 has flat and parallel surfaces on both sides, parallelism can be maintained when two or more layered bodies are layered (layered in multiple layers) as well. Moreover, since there are two or more metal layers, each metal layer can be assigned, for example, a ground layer or a power layer to separate the functions in the case of using the metal layers as a wiring layer. As a result, it is possible to form a wiring layer that is resistant to noise and hardly generates noise.

Second Embodiment

Figure 11:
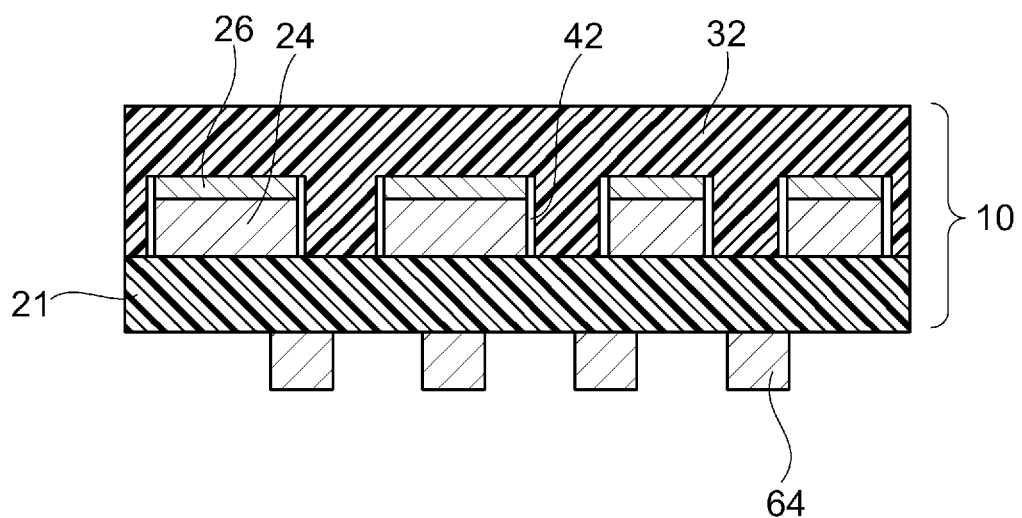
FIG. 11 is a schematic sectional view for explaining a method for producing a multilayered body according to a second embodiment.
Figure 12:
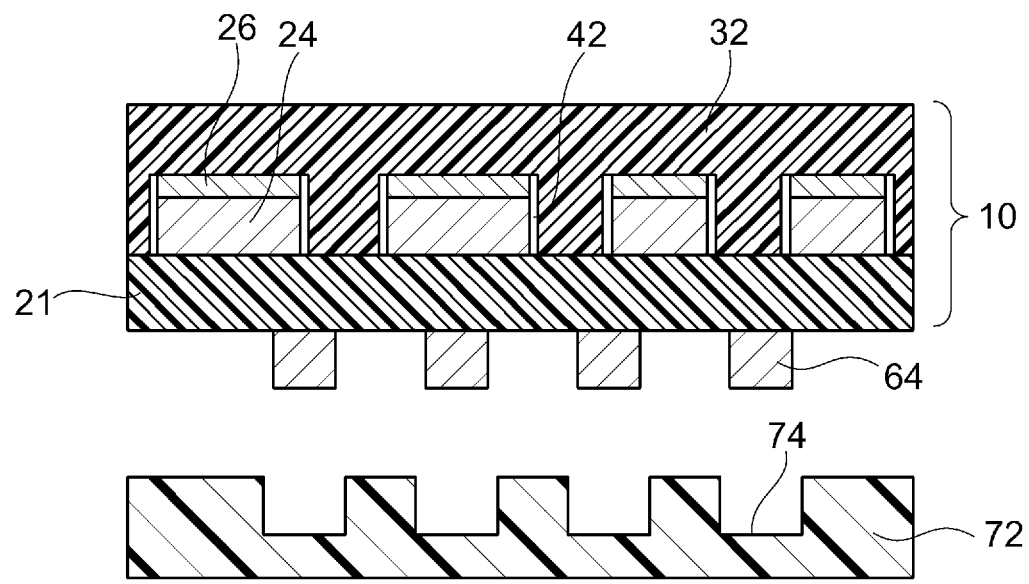
FIG. 12 is a schematic sectional view for explaining a method for producing a multilayered body according to a second embodiment.
Figure 13:
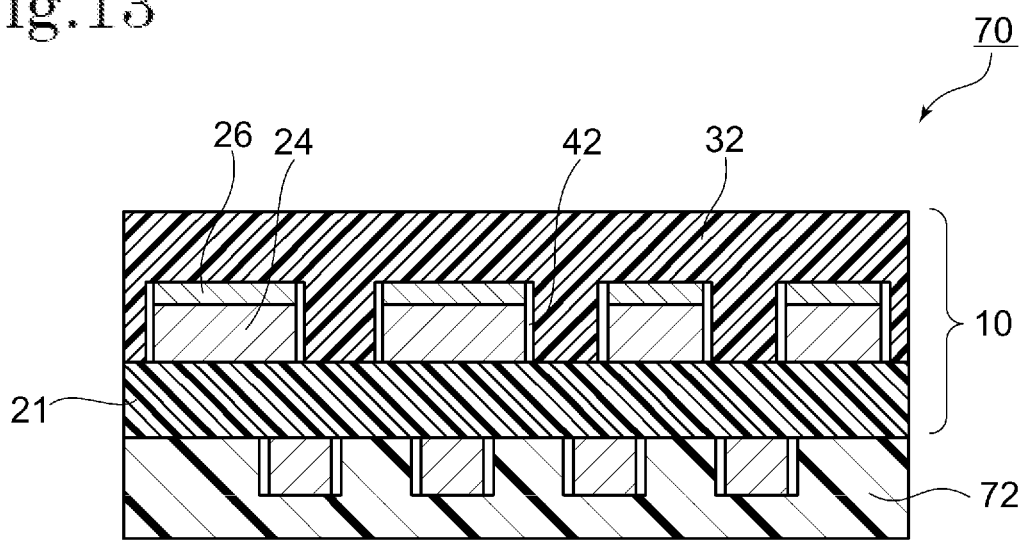
FIG. 13 is a schematic sectional view for explaining a method for producing a multilayered body according to a second embodiment.

FIGS. 10 to 13 are schematic sectional views for explaining the method for producing a multilayered body according to the second embodiment. As illustrated in FIG. 13, a multilayered body 70 according to the second embodiment has a configuration in which a layered body 10, a patterned second metal layer 64, and a third resin film 72 are layered in this order.

The multilayered body 70 can be produced by the following method.

First, the layered body 10 is prepared.

Figure 10:
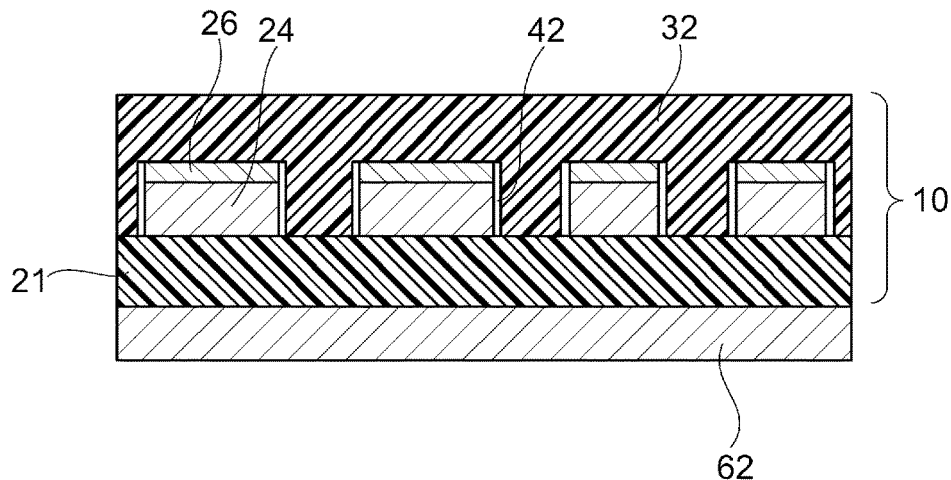
FIG. 10 is a schematic sectional view for explaining a method for producing a multilayered body according to a second embodiment.

Next, as illustrated in FIG. 10, an unpatterned second metal layer 62 is bonded to the first resin film 21 of the layered body 10. As the second metal layer 62, a similar one to the metal layer 22 may be used. Examples of the method for bonding the second metal layer 62 include bonding using a silane coupling agent and pressure bonding (more preferably pressure bonding after plasma treatment) similarly to those described above.

Next, the unpatterned second metal layer 62 is etched by a conventionally known method to form the patterned second metal layer 64 as illustrated in FIG. 11.

In the method for producing a multilayered body according to the second embodiment, separately from the step, the third resin film 72 having a concave 74 corresponding to the pattern (convex pattern) of the second metal layer 64 is prepared as illustrated in FIG. 12. The third resin film 72 can be prepared by a similar method to the method for preparing the second resin film 32.

After that, the second metal layer 64 and the third resin film 72 are bonded together while the pattern of the second metal layer 64 and the concave 74 of the third resin film 72 are fitted into each other as illustrated in FIG. 13. Examples of the bonding method include bonding using a silane coupling agent and pressure bonding (more preferably pressure bonding after plasma treatment) similarly to those described above. A void similar to the void 42 exists between a side surface of the concave 74 of the third resin film 72 and the side surface of the second metal layer 64 facing the side surface.

The material for the third resin film 72 is not particularly limited, but a similar material to that for the first resin film 21 may be used. Among others, the third resin film 72 is preferably a polyimide film. When the third resin film 72 is a polyimide film, a layered body exhibiting excellent heat resistance is obtained. The material for the third resin film 72, the material for the first resin film 21, and the material for the second resin film 32 may be the same as or different from one another.

The multilayered body 70 is obtained through the steps described above.

In the above-described multilayered body 70, a case where the patterned second metal layer 64 and the third resin film 72 are layered on the first resin film 21 of the layered body 10 in this order has been described. However, the multilayered body according to the present invention is not limited to this example, and the patterned second metal layer and the third resin film may be layered on the second resin film 32 of the layered body 10 in this order.

In the above-described multilayered body 70, a case where there are two metal layers, the metal layer 24 and the second metal layer 64, has been described. However, the multilayered body according to the present invention is not limited to this example, and there may be three or more metal layers. As the method for layering three or more metal layers, an additional patterned metal layer and an additional resin film may be further layered on either surface of the multilayered body 70 by the method described with reference to FIGS. 10 to 12.

According to the multilayered body of the second embodiment, since the layered body 10 has flat and parallel surfaces on both sides, parallelism can be maintained when the patterned second metal layer and the third resin film are further layered (layered in multiple layers) on the layered body 10 as well. In addition, the number of resin film layers can be decreased by one as compared with that in the multilayered body according to the first embodiment. Moreover, since there are two or more metal layers, each metal layer can be assigned, for example, a ground layer or a power layer to separate the functions in the case of using the metal layers as a wiring layer. As a result, it is possible to form a wiring layer that is resistant to noise and hardly generates noise. In addition, in a case where the metal layer is used as a heat source and the multilayered body is used as a planar heating element, it is possible to uniformly distribute the heat by two or more metal layers.

Third Embodiment

Figure 17:
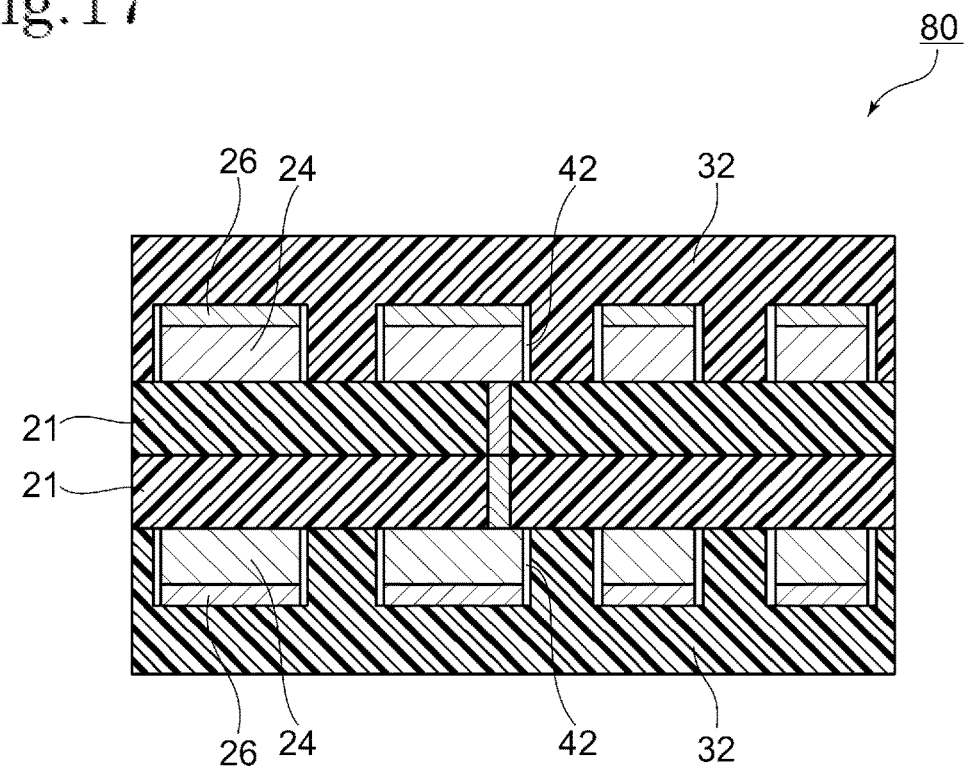
FIG. 17 is a schematic sectional view for explaining a method for producing a multilayered body according to a third embodiment.

FIGS. 14 to 17 are schematic sectional views for explaining the method for producing a multilayered body according to the third embodiment. As illustrated in FIG. 17, a multilayered body 80 according to the third embodiment has a configuration in which two layered bodies 10 are layered, a through hole 82 is provided in the first resin film 21, a metal-filled layer 84 filled with a metal is formed in the through hole 82, and the metal-filled layer 84 of one layered body 10 and the metal-filled layer 84 of the other layered body 10 are electrically connected to each other.

The multilayered body 80 may be produced by the following method.

First, the layered body 10 is prepared.

Figure 14:
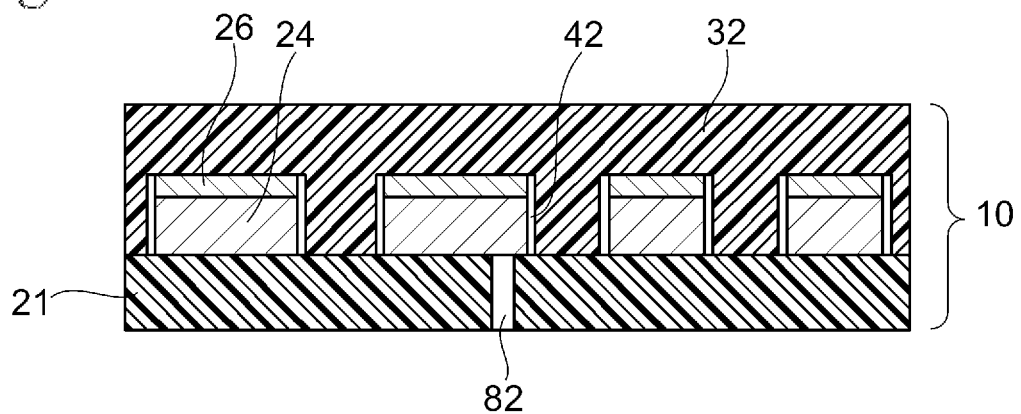
FIG. 14 is a schematic sectional view for explaining a method for producing a multilayered body according to a third embodiment.

Next, as illustrated in FIG. 14, the through hole 82 is formed in the first resin film 21 of the layered body 10 until the through hole 82 reaches the metal layer 24. The through hole 82 can be formed by a conventionally known method. The through hole 82 can be formed by laser processing, for example.

Figure 15:
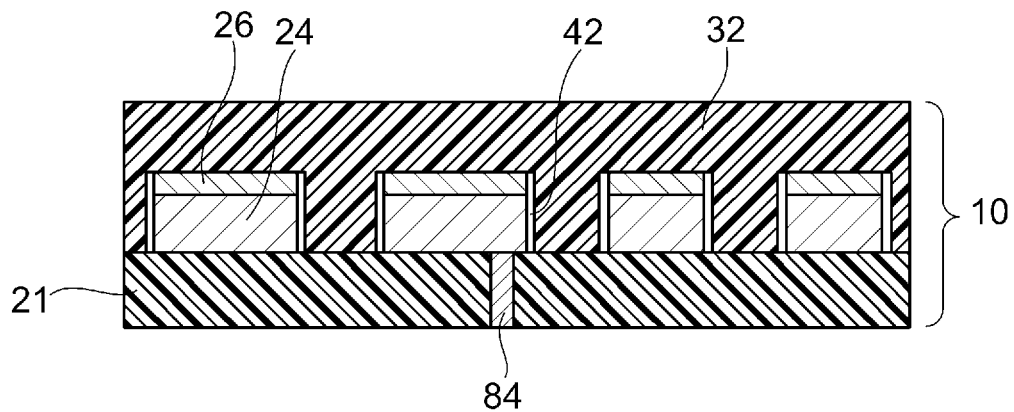
FIG. 15 is a schematic sectional view for explaining a method for producing a multilayered body according to a third embodiment.
Figure 16:
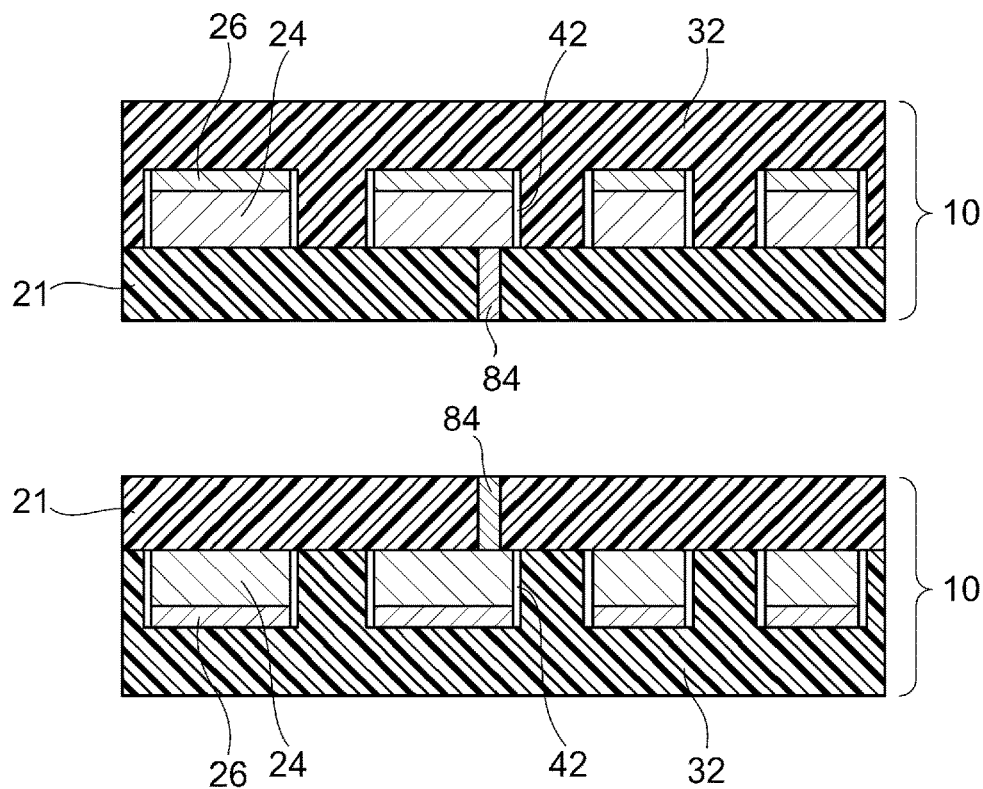
FIG. 16 is a schematic sectional view for explaining a method for producing a multilayered body according to a third embodiment.

Next, as illustrated in FIG. 15, a metal is filled in the through hole 82 to form the metal-filled layer 84. The method for forming the metal-filled layer 84 is not particularly limited, but for example, the metal-filled layer 84 is formed by filling a metal paste (silver paste or the like) in the through hole.

Another layered body 10 having the metal-filled layer 84 is fabricated in the same manner.

Next, two layered bodies 10 each having the metal-filled layer 84 are bonded together. At this time, the metal-filled layer 84 of one layered body 10 and the metal-filled layer 84 of the other layered body 10 are positioned so as to be electrically connected to each other, and then the two layered bodies 10 are bonded together.

The multilayered body 80 is obtained through the steps described above.

In the above-described multilayered body 80, a case where the metal-filled layer 84 is formed in the first resin film 21 of the layered body 10 has been described. However, the multilayered body according to the present invention is not limited to this example. For example, a metal-filled layer may be formed in the second resin film 32 of the layered body 10, and two layered bodies 10 each having a metal-filled layer formed in the second resin film 32 may be bonded together. A metal-filled layer may be formed in the first resin film 21 of one layered body 10, while a metal-filled layer may be formed in the second resin film 32 of the other layered body 10, and the two layered bodies 10 may be bonded together so that the metal-filled layers are electrically connected to each other.

The multilayered bodies of the first to third embodiments may be used by being further bonded together, for example, the multilayered body according to the first embodiment and the multilayered body according to the second embodiment may be bonded together. The bonding method is not particularly limited, but as already explained, bonding using a silane coupling agent and pressure bonding are preferable.

The embodiments of the present invention have been described above, but the present invention is not limited to the above-described examples, and design changes can be made as appropriate within the scope of satisfying the configuration of the present invention.

DESCRIPTION OF REFERENCE SIGNS

10 Layered body
20 First layered body
21 First resin film
22 Unpatterned metal layer
24 Patterned metal layer
25 Second side surface
26 Silane coupling agent layer
31 Unpatterned second resin film
32 Patterned second resin film
34 Concave
36 First side surface
42 Void
50, 70, 80 Multilayered body
62 Unpatterned second metal layer
64 Patterned second metal layer
72 Third resin film
74 Concave
82 Through hole
84 Metal-filled layer

The invention claimed is:

1. A method for producing a multilayered body, the method comprising:
   a step A of layering a first resin film and a first patterned metal layer,
   a step B of preparing a second resin film having a concave corresponding to the pattern of the first patterned metal layer,
   a step C of bonding the first patterned metal layer and the second resin film together, with a silane coupling agent layer disposed therebetween, while fitting the pattern of the first patterned metal layer and the concave of the second resin film into each other, to thereby form a layered body, and
   a step D of layering, in this order, the layered body, a second patterned metal layer, and a third resin film having a concave corresponding to the pattern of the second patterned metal layer,
   wherein
   a first void exists between a first side surface of the concave of the second resin film and a second side surface of the first patterned metal layer facing the first side surface, and
   a second void exists between a third side surface of the concave of the third resin film and a fourth side surface of the second patterned metal layer facing the third side surface.

2. The method according to claim 1, wherein
   a silane coupling agent layer is provided on the first patterned metal layer of, and
   the step C is a step of bonding the first patterned metal layer and the second resin film together with the silane coupling agent layer interposed therebetween.

3. The method according to claim 1, wherein
   a silane coupling agent layer is provided on the second resin film, and
   the step C is a step of bonding the first patterned metal layer and the second resin film together with the silane coupling agent layer interposed therebetween.

4. The method according to claim 1, wherein the first resin film and the second resin film are polyimide films.

5. The method according to claim 1, wherein the first patterned metal layer has a thickness of 10 μm or more and 100 μm or less.

6. A multilayered body comprising
   (a) a layered body having a first resin film, a first patterned metal layer, a silane coupling agent layer, and a second resin film having a concave corresponding to the pattern of the first patterned metal layer, which are layered in this order,
   (b) a second patterned metal layer, and
   (c) a third resin film having a concave corresponding to the pattern of the second patterned metal layer,
   which are layered in this order,
   wherein
   a first void exists between a first side surface of the concave of the second resin film and a second side surface of the first patterned metal layer facing the first side surface, and
   a second void exists between a third side surface of the concave of the third resin film and a fourth side surface of the second patterned metal layer facing the third side surface.

7. The multilayered body according to claim 6, wherein the first resin film and the second resin film are polyimide films.

8. The multilayered body according to claim 7, wherein the third resin film is a polyimide film.

9. The multilayered body according to claim 6, wherein the first patterned metal layer has a thickness of 10 μm or more and 100 μm or less.

10. The method according to claim 4, wherein the third resin film is a polyimide film.

* * * * *